United States Patent
Mo et al.

(10) Patent No.: US 11,411,178 B2
(45) Date of Patent: Aug. 9, 2022

(54) RESISTIVE RANDOM ACCESS MEMORY DEVICE

(71) Applicant: Taiwan Semiconductor Manufacturing Co., Ltd., Hsin-Chu (TW)

(72) Inventors: Chun-Chieh Mo, Kaohsiung (TW); Shih-Chi Kuo, Yangmei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/203,076

(22) Filed: Nov. 28, 2018

(65) Prior Publication Data

US 2019/0123270 A1    Apr. 25, 2019

Related U.S. Application Data

(62) Division of application No. 15/788,690, filed on Oct. 19, 2017, now Pat. No. 11,289,647.

(51) Int. Cl.
   *H01L 45/00*    (2006.01)
   *H01L 27/24*    (2006.01)

(52) U.S. Cl.
   CPC ........ *H01L 45/124* (2013.01); *H01L 27/2436* (2013.01); *H01L 45/04* (2013.01); *H01L 45/1253* (2013.01); *H01L 45/145* (2013.01); *H01L 45/1616* (2013.01); *H01L 45/1608* (2013.01)

(58) Field of Classification Search
   CPC ... H01L 45/124; H01L 45/1683; H01I 45/124
   See application file for complete search history.

(56) References Cited

U.S. PATENT DOCUMENTS

| | | | | |
|---|---|---|---|---|
| 2003/0213980 A1* | 11/2003 | Tanaka | ................ | H01L 23/3114 257/200 |
| 2004/0026731 A1* | 2/2004 | Fournier | ............. | H01L 45/1233 257/314 |
| 2009/0236583 A1* | 9/2009 | Kuo | ................... | G11C 13/0004 257/4 |
| 2011/0095258 A1 | 4/2011 | Ku et al. | | |
| 2011/0186798 A1* | 8/2011 | Kwon | ..................... | H01L 45/06 257/2 |
| 2013/0095633 A1 | 4/2013 | Kakegawa | | |
| 2013/0122651 A1* | 5/2013 | Fujii | .................. | H01L 45/1616 438/104 |
| 2014/0231742 A1* | 8/2014 | Jang | .................... | H01L 45/1253 257/3 |

FOREIGN PATENT DOCUMENTS

TW    201138173 A    11/2011

OTHER PUBLICATIONS

Dopy of Official Action issued Jul. 24, 2019, in corresponding Taiwan Patent Application No. 10820700140.

\* cited by examiner

*Primary Examiner* — John A Bodnar
(74) *Attorney, Agent, or Firm* — Duane Morris LLP

(57) ABSTRACT

A memory cell includes: a first electrode; a resistive material layer comprising one horizontal portion and two vertical portions that are respectively coupled to ends of the horizontal portion; and a second electrode, wherein the second electrode is partially surrounded by a top boundary of the U-shaped profile and the first electrode extends along part of a bottom boundary of the U-shaped profile.

20 Claims, 12 Drawing Sheets

RESISTIVE RANDOM ACCESS MEMORY DEVICE

CROSS-REFERENCE TO RELATED APPLICATION

The present application is a divisional application of U.S. patent application Ser. No. 15/788,690, filed on Oct. 19, 2017, which is incorporated by reference herein in its entirety.

BACKGROUND

In recent years, unconventional nonvolatile memory (NVM) devices, such as ferroelectric random access memory (FRAM) devices, phase-change random access memory (PRAM) devices, and resistive random access memory (RRAM) devices, have emerged. In particular, RRAM devices, which exhibit a switching behavior between a high resistance state and a low resistance state, have various advantages over conventional NVM devices. Such advantages include, for example, compatible fabrication steps with current complementary-metal-oxide-semiconductor (CMOS) technologies, low-cost fabrication, a compact structure, flexible scalability, fast switching, high integration density, etc.

As integrated circuits (ICs), which include such RRAM devices, become more powerful, it is desirable to maximize the number of the RRAM devices in the IC accordingly. Generally, an RRAM device includes a top electrode (e.g., an anode) and a bottom electrode (e.g., a cathode) with a variable resistive material layer interposed therebetween. In particular, an active area of the variable resistive material layer typically extends in parallel with the top and bottom electrodes, respectively. Forming the RRAM device in such a stack configuration that each layer can only extend two-dimensionally may encounter a trade-off between maximizing the number of the RRAM devices in the IC and maintaining optimal performance of the RRAM device. For example, the number of the RRAM devices is typically proportional to a number of the active areas of the variable resistive material layers. As such, within a given area of the IC, when the number of the RRAM devices is increased, the active area of each of the RRAM device shrinks, which may disadvantageously impact respective performance of each of the RRAM devices due to weaker signal coupling between respective top and bottom electrodes.

Thus, existing RRAM devices and methods to make the same are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1A:
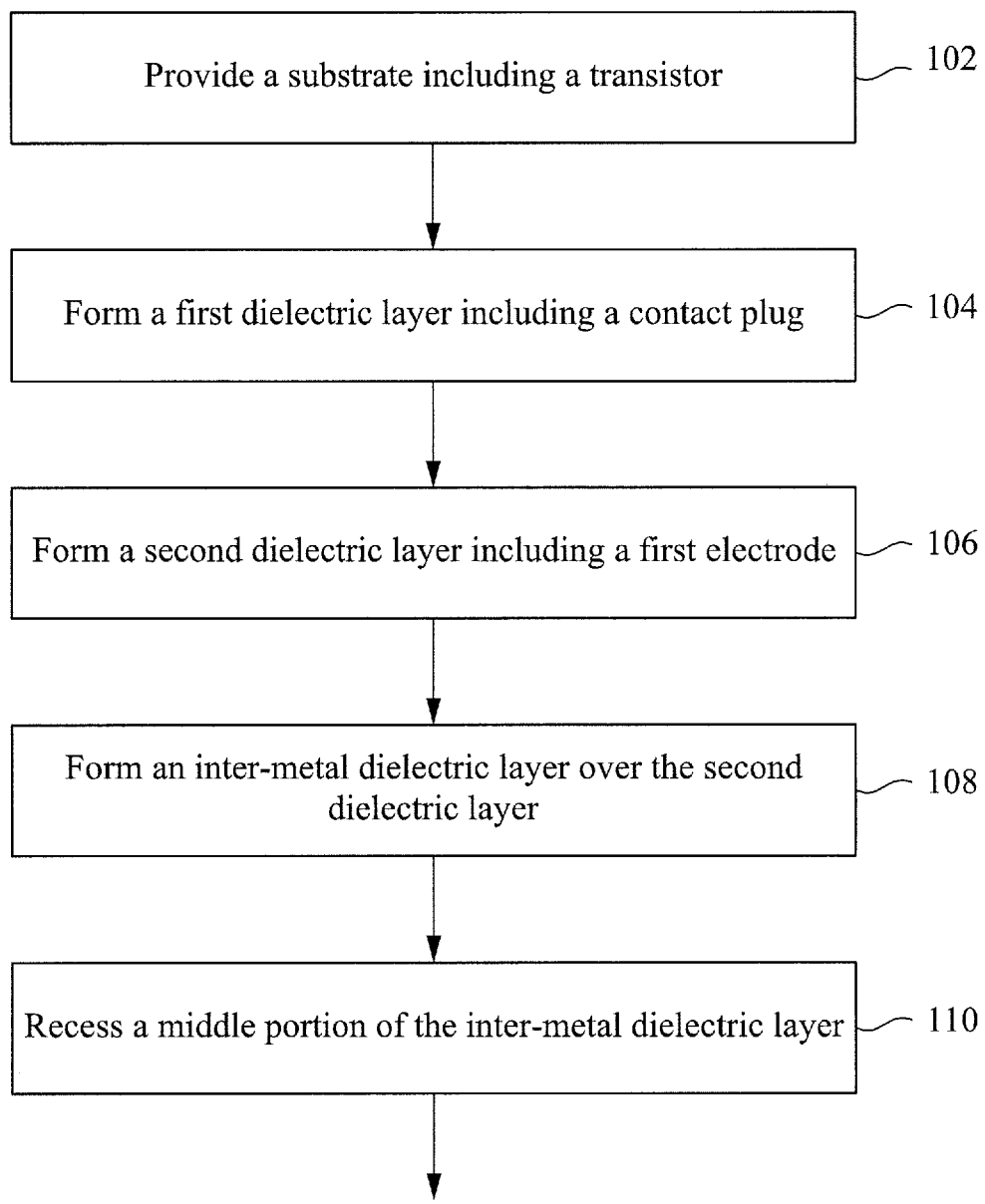
FIGS. 1A and 1B illustrate a flow chart of an exemplary method for forming a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a novel RRAM device and methods to form the same. In some embodiments, the disclosed RRAM device includes an RRAM resistor including a U-shaped variable resistive material layer. More specifically, in some embodiments, the U-shaped variable resistive material layer has a convex bottom boundary and a concave top boundary that are coupled to a bottom electrode and a top electrode, respectively. Forming such an U-shaped variable resistive material layer in the RRAM resistor may provide various advantages. For example, when compared to the aforementioned conventional RRAM device, within a given area, forming the variable resistive material layer in such a U-shaped profile may substantially increase an active area of the variable resistive material layer that can be coupled to at least one of the top and bottom electrodes. Alternatively stated, when making an IC to integrate plural disclosed RRAM devices, the above-mentioned trade-off between the performance and the number of RRAM devices that can be integrated may be advantageously eliminated.

Figure 1B:
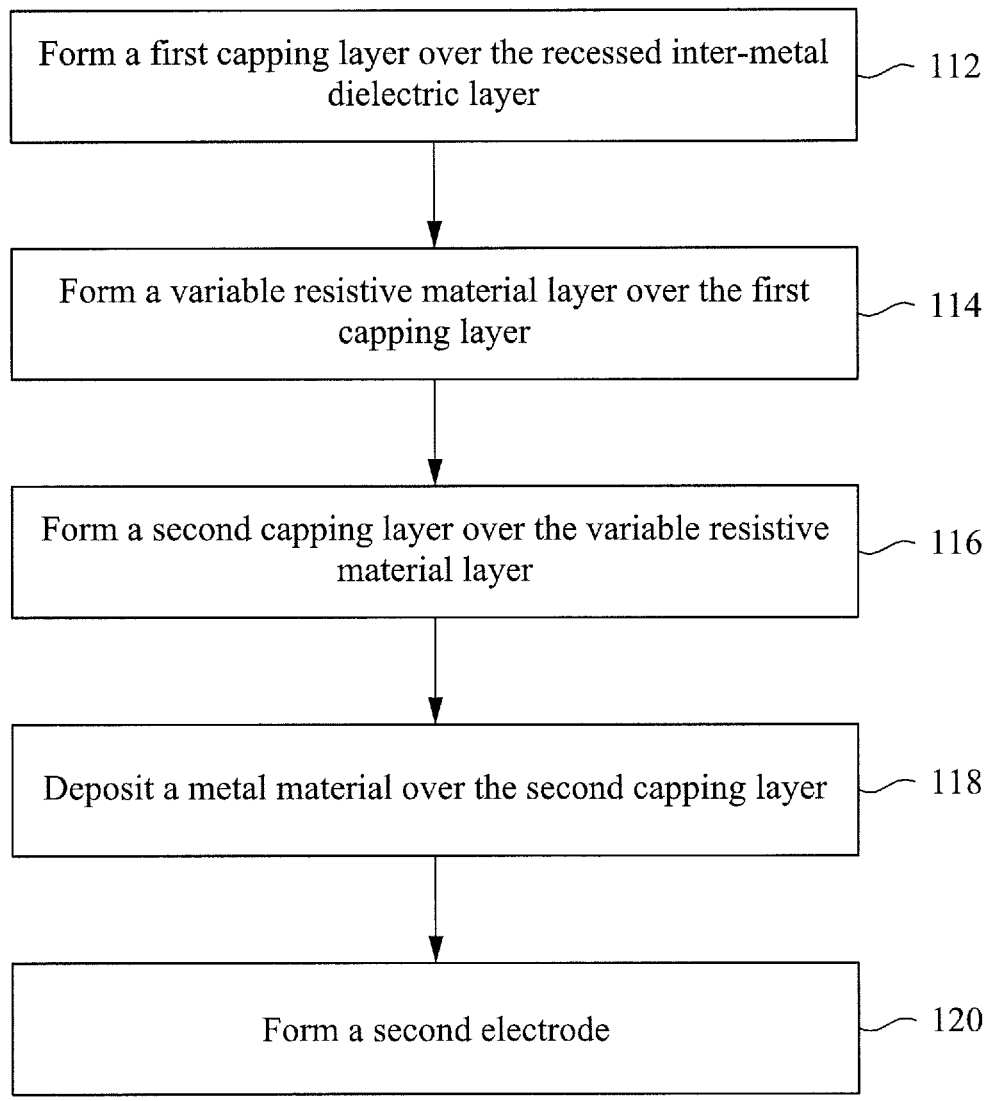

FIGS. 1A and 1B illustrate a flowchart of a method 100 to form a semiconductor device according to one or more embodiments of the present disclosure. It is noted that the method 100 is merely an example, and is not intended to limit the present disclosure. In some embodiments, the semiconductor device is, at least part of, an RRAM device. As employed by the present disclosure, the RRAM device refers to any device including a variable resistive material layer. It is noted that the method 100 of FIGS. 1A and 1B does not produce a completed RRAM device. A completed RRAM device may be fabricated using complementary metal-oxide-semiconductor (CMOS) technology processing. Accordingly, it is understood that additional operations may be provided before, during, and after the method 100 of FIGS. 1A and 1B, and that some other operations may only be briefly described herein. In some other embodiments, the method may be used to faun any of a variety of nonvolatile memory (NVM) devices, such as ferroelectric random access memory (FRAM) devices, phase-change random access memory (PRAM) devices, resistive random access memory (RRAM) devices, etc., while remaining within the scope of the present disclosure.

Referring first to FIG. 1A, in some embodiments, the method 100 starts with operation 102 in which a substrate including a transistor is provided. The method 100 continues to operation 104 in which a first dielectric layer including a contact plug is formed. In some embodiments, the first dielectric layer is formed over the transistor, and the contact plug extends through the first dielectric layer and is coupled to at least one of conductive feature (e.g., a drain, a source, a gate, etc.) of the transistor. The method 100 continues to operation 106 in which a second dielectric layer including a first electrode is formed over the first dielectric layer. In some embodiments, the first electrode horizontally extends along the second dielectric layer, and is coupled to the contact plug. The method 100 continues to operation 108 in which an inter-metal dielectric layer is formed over the second dielectric layer. In some embodiments, the inter-metal dielectric layer may include multiple layers stacked on the top of one another, which will be discussed below. The method 100 continues to operation 110 in which a middle portion of the inter-metal dielectric layer is recessed. In some embodiments, the recessed inter-metal dielectric layer may expose at least a portion of a top surface of the first electrode, and inner sidewalls of the inter-metal dielectric layer. Accordingly, in some embodiments, the recessed inter-metal dielectric layer may form a U-shaped profile surrounded by the exposed portion of the top surface of the first electrode and the inner sidewalls of the inter-metal dielectric layer.

Referring then to FIG. 1B, the method 100 continues to operation 112 in which a first capping layer is formed over the recessed inter-metal dielectric layer. The method 100 continues to operation 114 in which a variable resistive material layer is formed over the first capping layer. The method 100 continues to operation 116 in which a second capping layer is formed over the variable resistive material layer. In some embodiments, the first capping layer, the variable resistive material layer, and the second capping layer, formed at operations 112, 114, and 116, respectively, are each substantially conformal and thin. As such, each of the first capping layer, the variable resistive material layer, and the second capping layer may follow the U-shaped profile, which will be discussed in further detail below. The method 100 continues to operation 118 in which a metal material is deposited over the second capping layer. In some embodiment, the deposited metal material refills the U-shaped profile with the first capping layer, the variable resistive material layer, and the second capping layer disposed therebetween. The method 100 continues to operation 120 in which a second electrode is formed. In some embodiments, the second electrode is formed by the deposited metal material refilling the U-shaped profile. As such, the second electrode's sidewalls and bottom surface are each coupled to a respective portion of the variable resistive material layer, as will be discussed below.

In some embodiments, operations of the method 100 may be associated with cross-sectional views of a semiconductor device 200 at various fabrication stages as shown in FIGS. 2A, 2B, 2C, 2D, 2E, 2F, 2G, 2H, 2I, and 2J, respectively. In some embodiments, the semiconductor device 200 may be an RRAM device. The RRAM device 200 may be included in a microprocessor, memory cell, and/or other integrated circuit (IC). Also, FIGS. 2A through 2J are simplified for a better understanding of the concepts of the present disclosure. For example, although the figures illustrate the RRAM device 200, it is understood that the IC, in which the RRAM device 200 is formed, may include a number of other devices comprising resistors, capacitors, inductors, fuses, etc., which are not shown in FIGS. 2A through 2J, for purposes of clarity of illustration.

Figure 2A:
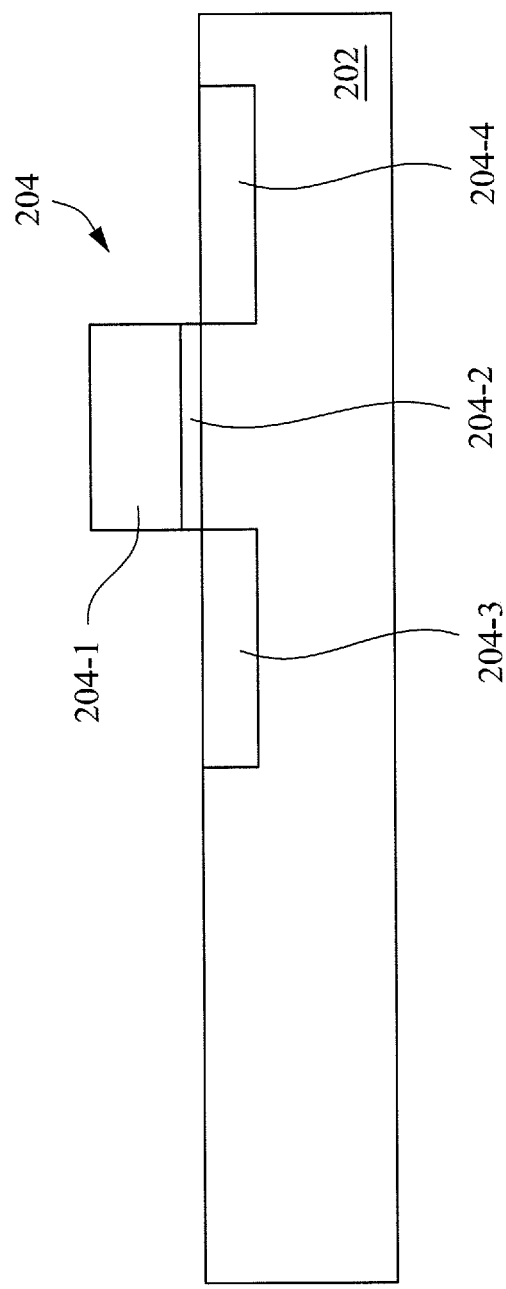
FIGS. 2A, 2B, 2C, 2D, 2E, 2F, 2G, 2H, 2I, and 2J illustrate cross-sectional views of an exemplary semiconductor device during various fabrication stages, made by the method of FIG. 1, in accordance with some embodiments.

Corresponding to operation 102 of FIG. 1A, FIG. 2A is a cross-sectional view of the RRAM device 200 including a substrate 202 with a transistor 204, which is provided, at one of the various stages of fabrication, according to some embodiments. Although the RRAM device 200 in the illustrated embodiment of FIG. 2A includes only one transistor 204, it is understood that the illustrated embodiment of FIG. 2A and the following figures are merely provided for illustration purposes. Thus, the RRAM device 200 may include any desired number of transistors while remaining within the scope of the present disclosure.

In some embodiments, the substrate 202 includes a semiconductor material substrate, for example, silicon. Alternatively, the substrate 202 may include other elementary semiconductor material such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate may have an epitaxial layer overlying a bulk semiconductor. Furthermore, the substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In some embodiments, the transistor 204 includes a gate electrode 204-1, a gate dielectric layer 204-2, and source/drain features 204-3 and 204-4. The source/drain features 204-3 and 204-4 may be formed using doping processes such as ion implantation. The gate dielectric layer 204-2 may include a dielectric material such as, silicon oxide, silicon nitride, silicon oxinitride, dielectric with a high dielectric constant (high k), and/or combinations thereof, which may be formed using deposition processes such as atomic layer deposition (ALD). The gate electrode 204-1 may include a conductive material, such as polysilicon or a metal, which may be formed using deposition processes such as chemical vapor deposition (CVD). As will be discussed in further detail below, the transistor 204 may serve as an access transistor of the RRAM device 200, which controls an access to a data storage component (e.g., an RRAM resistor) of the RRAM device 200 during read/write operations.

Figure 2B:
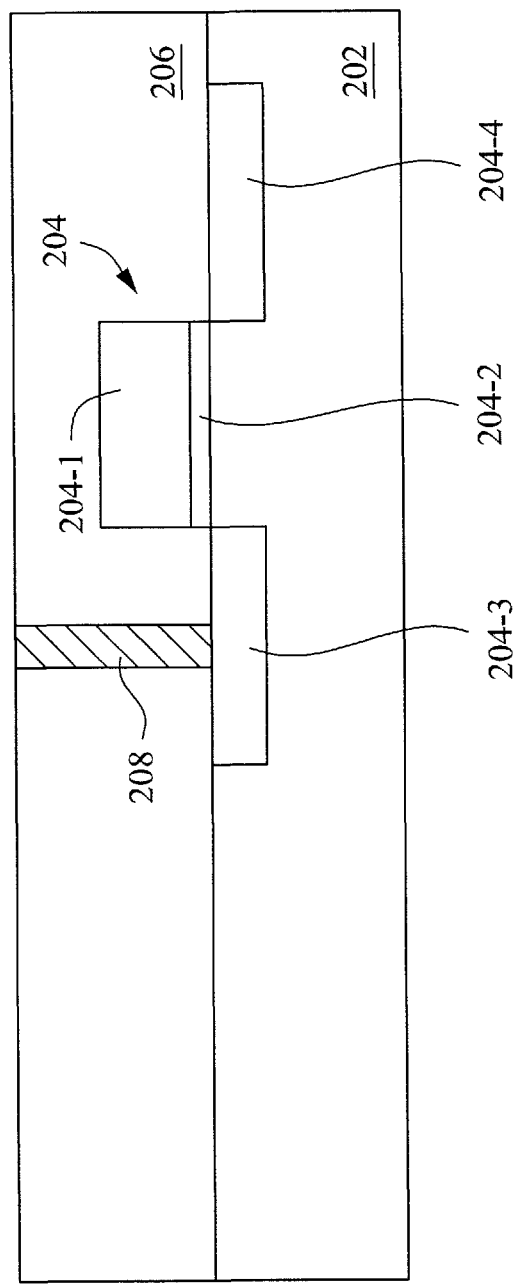

Corresponding to operation 104 of FIG. 1A, FIG. 2B is a cross-sectional view of the RRAM device 200 including a first dielectric layer 206 with a contact plug 208, which is formed, at one of the various stages of fabrication, according to some embodiments. As shown, the first dielectric layer 206 is formed over the transistor 204, and the contact plug 208 is fruited to extend through the first dielectric layer 206. In some embodiments, the contact plug 208 is coupled to at least one of the conductive features of the transistor 204. In the illustrated embodiment of FIG. 2B, the contact plug 208 is coupled to the source/drain feature 204-3.

In some embodiments, the first dielectric layer 206 is formed of a dielectric material. Such a dielectric material may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), strontium oxide (SrO), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the contact plug 208 is formed of a conductive material such as, for example, copper (Cu), aluminum (Al), tungsten (W), etc.

The contact plug 208 may be formed by at least some of the following process steps: using chemical vapor deposition (CVD), physical vapor deposition (PVD), spin-on coating, and/or other suitable techniques to deposit the above-described dielectric material of the first dielectric layer 206 over the substrate 202 and the transistor 204; performing one or more patterning processes (e.g., a lithography process, a dry/wet etching process, a cleaning process, a soft/hard baking process, etc.) to form an opening through the dielectric material; using CVD, PVD, E-gun, and/or other suitable techniques to deposit the above-described conductive material to refill the opening; and polishing out excessive conductive material to form the contact plug 208.

Figure 2C:
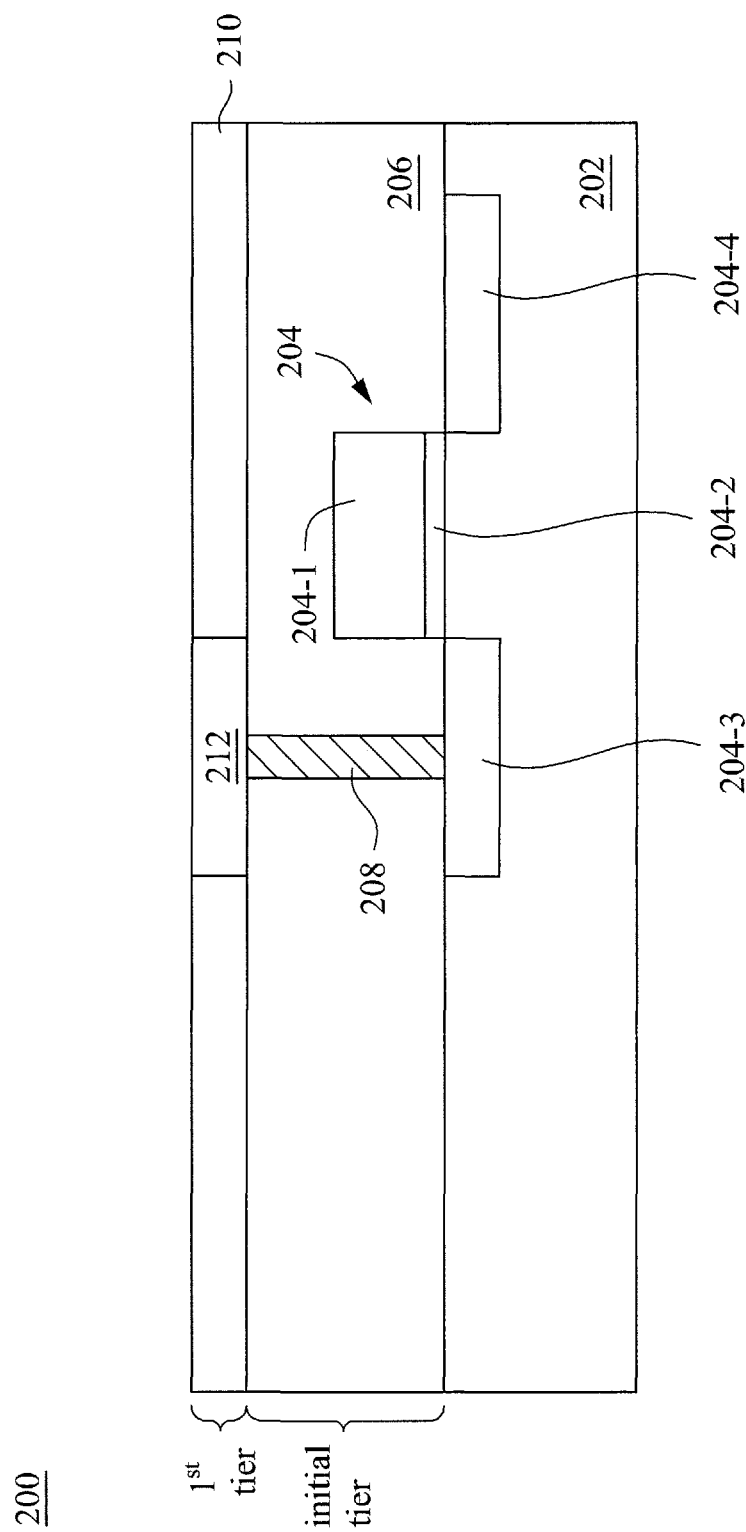

Corresponding to operation 106 of FIG. 1A, FIG. 2C is a cross-sectional view of the RRAM device 200 including a second dielectric layer 210 with a first electrode 212, which is formed, at one of the various stages of fabrication, according to some embodiments. As shown, the first electrode 212 is embedded in the second dielectric layer 210 and horizontally extend along the second dielectric layer 210. In some embodiment, the first electrode 212 is coupled to the contact plug 208, and as will be discussed below, the first electrode 212 may serve as a bottom electrode of the data storage component (e.g., an RRAM resistor) of the RRAM device 200.

In some embodiments, the second dielectric layer 210 is formed of a dielectric material. Such a dielectric material may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), strontium oxide (SrO), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the first electrode 212 is formed of a conductive material such as, for example, copper (Cu), aluminum (Al), tungsten (W), etc.

The first electrode 212 may be formed by at least some of the following process steps: using chemical vapor deposition (CVD), physical vapor deposition (PVD), spin-on coating, and/or other suitable techniques to deposit the above-described dielectric material of the second dielectric layer 210 over the first dielectric layer 206; performing one or more patterning processes (e.g., a lithography process, a dry/wet etching process, a cleaning process, a soft/hard baking process, etc.) to form an opening through the dielectric material so as to expose the contact plug 208; using CVD, PVD, E-gun, and/or other suitable techniques to deposit the above-described conductive material to refill the opening; and polishing out excessive conductive material to form the first electrode 212.

In some embodiments, the first dielectric layer 206 including the contact plug 208 extending therethrough is herein referred to as "initial tier/tier 0;" and the second dielectric layer 210 including the first electrode 212 extending therethrough is herein referred to as "first tier (1st tier)." Although in the illustrated embodiments of FIG. 2C (and the following figures), the first tier is directly above the initial tier, it is noted that between the initial tier and the first tier, there may be any desired number of tiers that are each substantially similar to the first tier while remaining within the scope of the present disclosure.

Figure 2D:
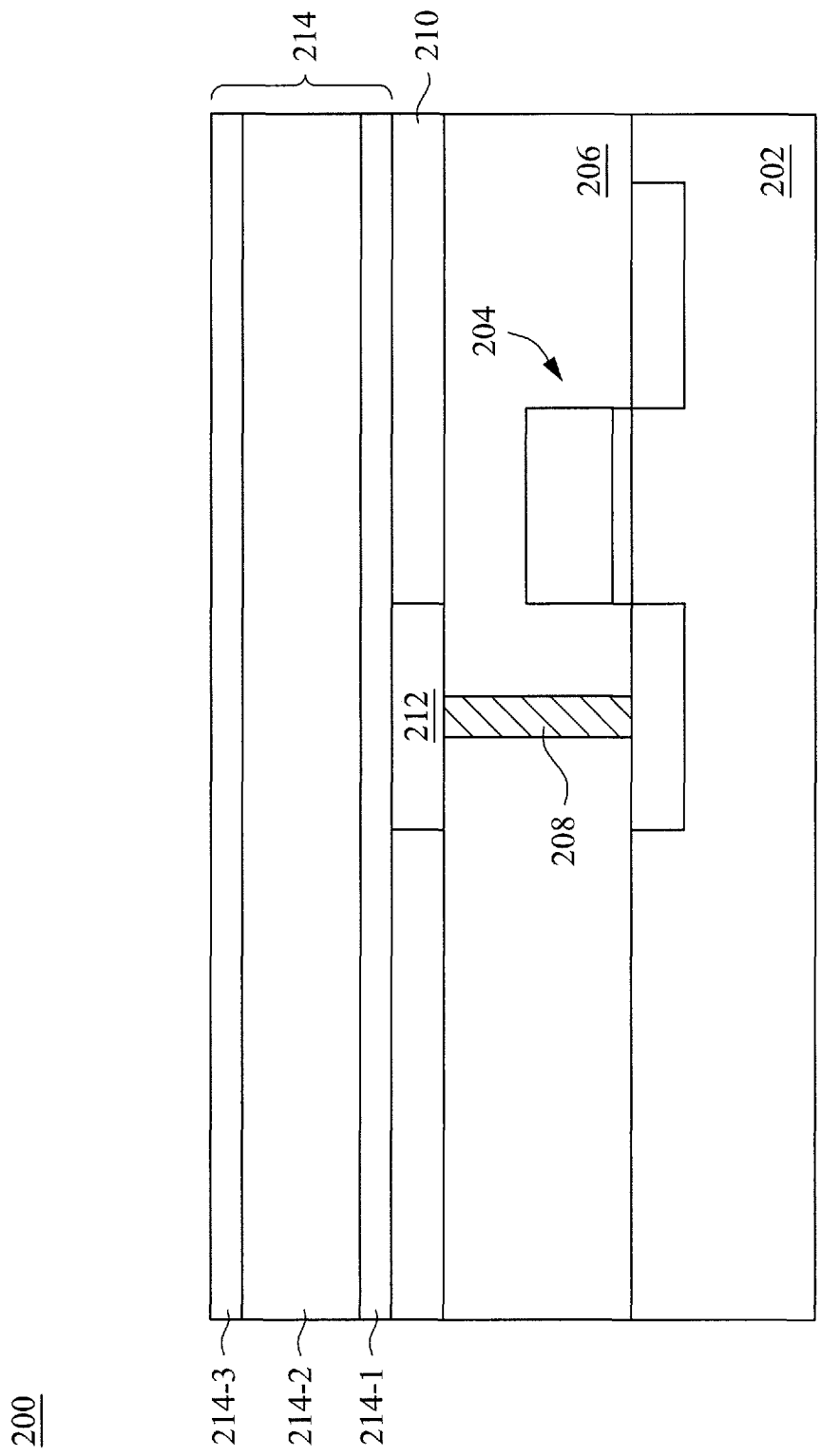

Corresponding to operation 108 of FIG. 1A, FIG. 2D is a cross-sectional view of the RRAM device 200 including an inter-metal dielectric (IMD) layer 214, which is formed, at one of the various stages of fabrication, according to some embodiments. As mentioned above, in some embodiments, the IMD layer 214 includes multiple layers stacked on the top of one another. For example, in FIG. 2D, the IMD layer 214 includes a first stacked layer 214-1, a second stacked layer 214-2, and a third stacked layer 214-3. In some embodiments, the first and third stacked layers 214-1 and 214-3 are also referred to as an etch stop layer and a polishing stop layer, respectively, which may be each formed of silicon carbide, silicon oxynitride, silicon nitride, carbon doped silicon nitride, or carbon doped silicon oxide. In some embodiments, The first/third stacked layer 214-1/214-3 is selected to have a different etch selectivity than the second stacked layer 214-2. In some embodiments, the first and third stacked layers 214-1 and 214-3 may each have a thickness about 100~300 angstrom (A).

In some embodiments, the second stacked layer 214-2 is formed of a dielectric material. Such a dielectric material may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), strontium oxide (SrO), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the second stacked layer 214-2 may have a thickness relatively thicker than the first and third stacked layers 214-1 and 214-3, which is about 200~400 angstrom (A).

In some embodiments, the first, second, and third stacked layers of the IMD layer 214 may be sequentially formed by performing plural iterations of process steps. For example, the first stacked layer 214-1 may be formed by using chemical vapor deposition (CVD), physical vapor deposition (PVD), spin-on coating, and/or other suitable techniques to deposit the above-described dielectric material of the first stacked layer 214-1 over the second dielectric layer 210; the second stacked layer 214-2 may be formed by using chemical vapor deposition (CVD), physical vapor deposition (PVD), spin-on coating, and/or other suitable techniques to deposit the above-described dielectric material of the second stacked layer 214-2 over the first stacked layer 214-1; and the third stacked layer 214-3 may be formed by using chemical vapor deposition (CVD), physical vapor deposition (PVD), spin-on coating, and/or other suitable techniques to deposit the above-described dielectric material of the third stacked layer 214-3 over the second stacked layer 214-2.

Figure 2E:
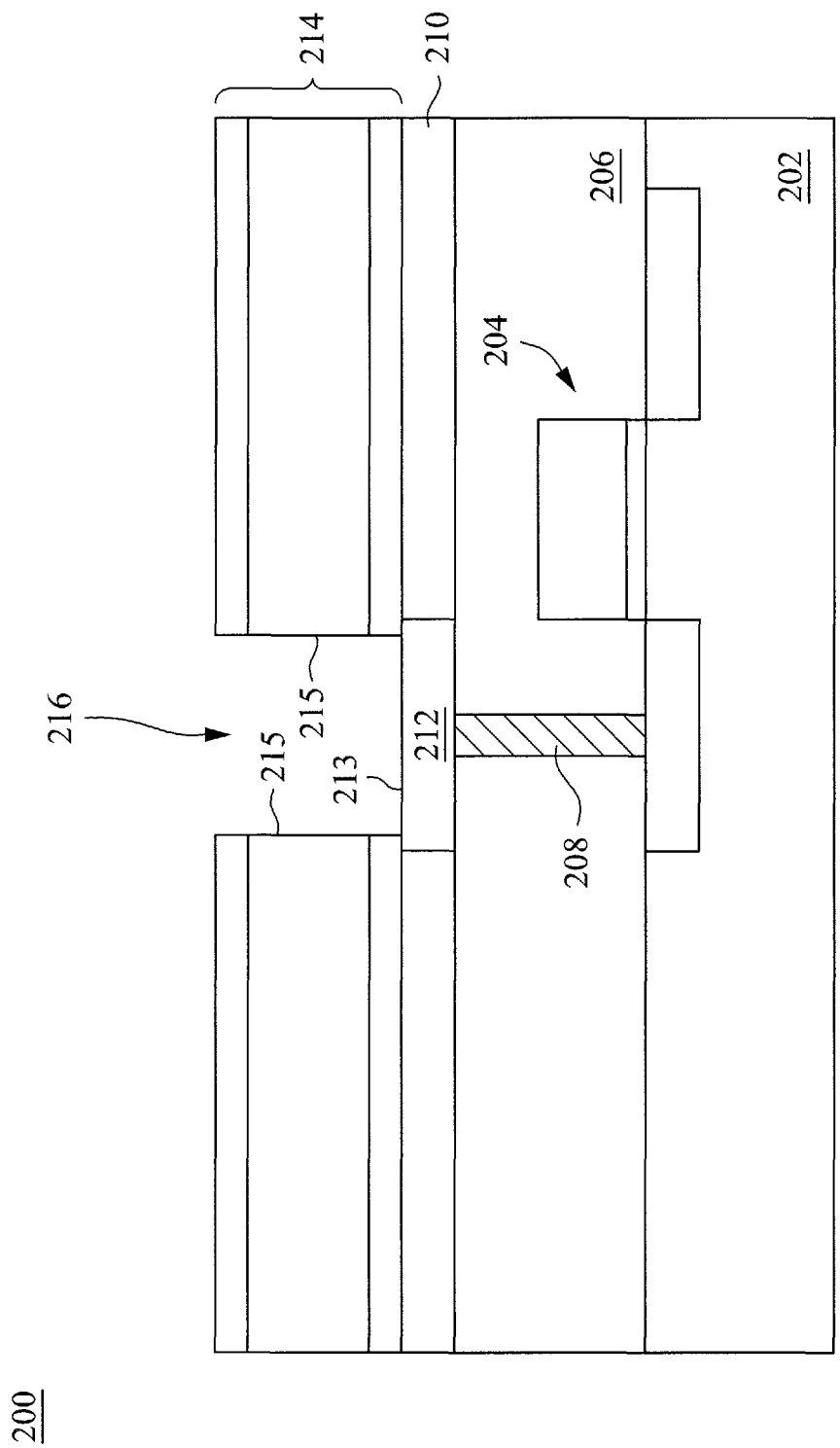

Corresponding to operation 110 of FIG. 1A, FIG. 2E is a cross-sectional view of the RRAM device 200 in which the IMD layer 214 is recessed at one of the various stages of fabrication, according to some embodiments. As shown, a middle portion of the IMD layer 214 is recessed to expose a portion of a top surface 213 of the first electrode 212 and inner sidewalls 215 of the IMD layer 214, which form a U-shaped profile 216 in the IMD layer 214. In other words, the U-shaped profile 216 is defined by the exposed top surface 213 and inner sidewalls 215.

In some embodiments, the U-shaped profile 216 is formed by performing at least some of the following processes: forming an optional anti-reflective coating (ARC) layer over the IMD layer 214 (FIG. 2D); forming a patternable layer (e.g., a photoresist layer) with an opening that is aligned with the first electrode 212; while using the patternable layer as a mask, performing one or more dry etching processes to remove respective portions of the IMD layer 214 that are not covered by the patternable layer; and removing the patternable layer.

Figure 2F:
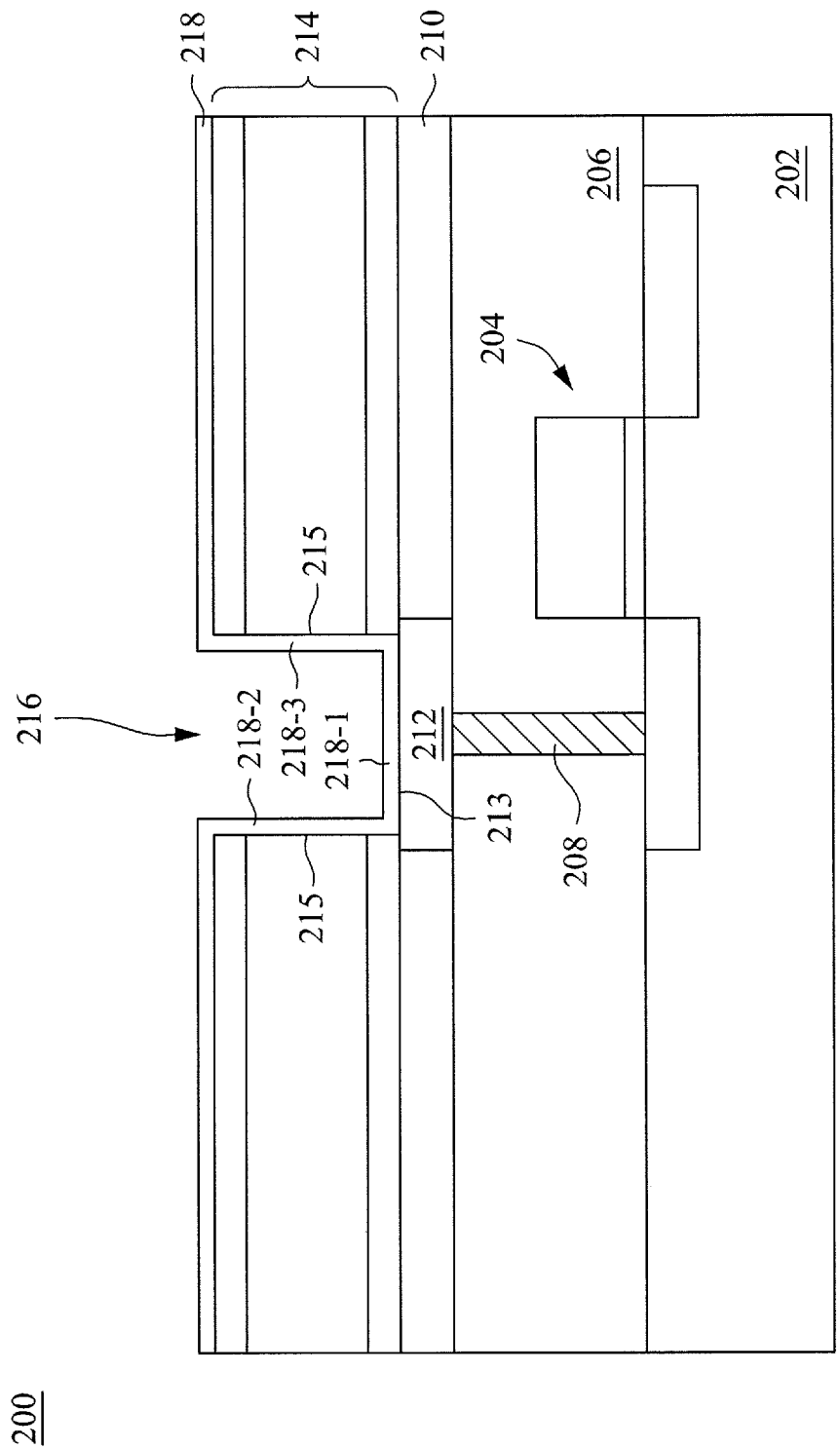

Corresponding to operation 112 of FIG. 1B, FIG. 2F is a cross-sectional view of the RRAM device 200 including a first capping layer 218, which is formed over the U-shaped profile 216, at one of the various stages of fabrication, according to some embodiments. As shown, the first capping layer 218 is formed to overlay the U-shaped profile 216 (i.e., covering the top surface 213 and extending along the inner sidewalls 215), and further overlay a top surface of the IMD layer 214. In some embodiments, the first capping layer 218 is substantially conformal and thin (e.g., about 100~300 Å in thickness) so that the first capping layer 218 may follow the U-shaped profile 216. As such, in some embodiments, the first capping layer 218 includes at least a horizontal portion 218-1 that is coupled to the top surface 213 of the first electrode 212, and two vertical portions 218-2 and 218-3 that are respectively coupled to the inner sidewalls 215 of the IMD layer 214, wherein the two vertical portions 218-2 and 218-3 are respectively coupled to two ends of the horizontal portion 218-1. It is noted that the term "vertical portion," as used herein, does not necessarily imply a surface of such a vertical portion and an intersecting surface form an absolute right angle. For example, each of the vertical portions 218-2 and 218-3 and the horizontal portion 218-1 may form an acute or obtuse angle while remaining within the scope of the present disclosure.

In some embodiments, the first capping layer 218 may be formed from materials such as, for example, gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), or any alloy, oxide, nitride, fluoride, carbide, boride or silicide of these, such as TaN, TiN, TiAlN, TiW, or a combination thereof. Although the first capping layer 218 is shown as a single layer in the illustrated embodiment of FIG. 2F (and the following figures), it is noted that the first capping layer 218 may include plural layers formed as a stack, wherein each of the plural layers is formed of one of the above-described materials, e.g., TaN, TiN, etc. In some embodiments, the first capping layer 218 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the IMD layer 214.

Figure 2G:
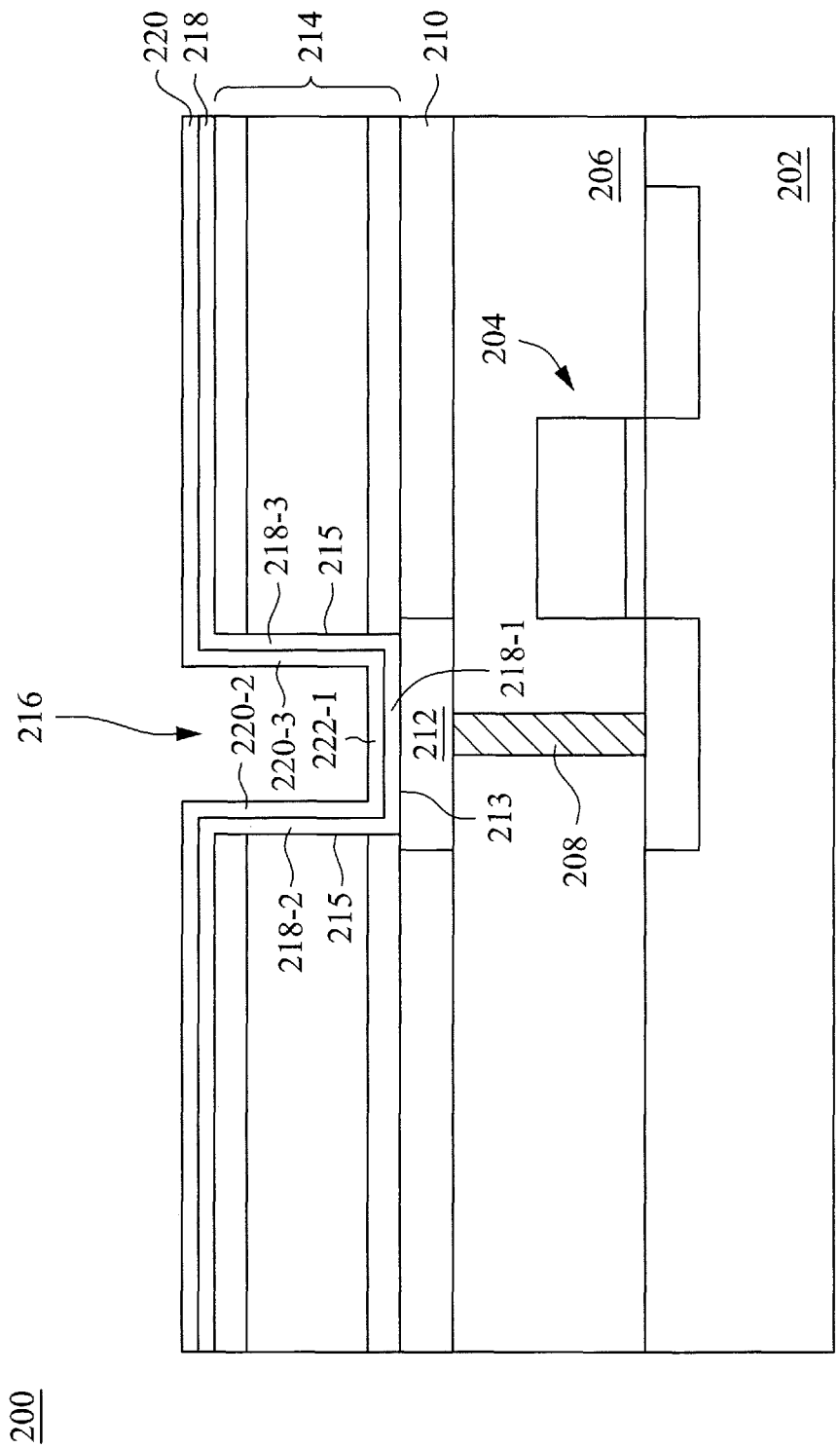

Corresponding to operation 114 of FIG. 1B, FIG. 2G is a cross-sectional view of the RRAM device 200 including a variable resistive material layer 220, which is formed at one of the various stages of fabrication, according to some embodiments. As shown, the variable resistive material 220 is formed to overlay the first capping layer 218. In some embodiments, the variable resistive material layer 220 is substantially conformal and thin (e.g., about 20~100 Å in thickness) so that the variable resistive material layer 220 may still follow the U-shaped profile 216.

As such, in some embodiments, the variable resistive material layer 220 includes at least a horizontal portion 220-1 that is coupled to the top surface 213 of the first electrode 212 through the horizontal portion 218-1 of the first capping layer 218, and two vertical portions 220-2 and 220-3 that are respectively coupled to the inner sidewalls 215 of the IMD layer 214 through the vertical portions 218-2 and 218-3 of the first capping layer 218. More specifically, the two vertical portions 220-2 and 220-3 are respectively coupled to two ends of the horizontal portion 220-1. When viewing perspectively, the variable resistive material layer 220 may have a concave top boundary, and a convex bottom boundary that is partially coupled to the first electrode 212 through the first capping layer 218.

In some embodiments, the variable resistive material layer 220 is a layer having a resistance conversion characteristic (e.g. variable resistance). In other words, the variable resistive material layer 220 includes material characterized to show reversible resistance variance in accordance with a polarity and/or an amplitude of an applied electrical pulse. The variable resistive material layer 220 includes a dielectric layer. The variable resistive material layer 220 may be changed into a conductor or an insulator based on polarity and/or magnitude of electrical signal.

In one embodiment, the variable resistive layer 220 may include a transition metal oxide. The transition metal oxide maybe denoted as $M_xO_y$, where M is a transition metal, O is oxygen, x is the transition metal composition, and y is the oxygen composition. In an embodiment, the variable resistive material layer 220 includes $ZrO_2$. Examples of other materials suitable for the variable resistive material layer 220 include: NiO, $TiO_2$, HfO, ZrO, ZnO, $WO_3$, CoO, $Nb_2O_5$, $Fe_2O_3$, CuO, $CrO_2$, $SrZrO_3$ (Nb-doped), and/or other materials known in the art. In another embodiment, the variable resistive layer 220 may include a colossal magnetoresistance (CMR)-based material such as, for example, $Pr_{0.7}Ca_{0.3}$, $MnO_3$, etc.

In yet another embodiment, the variable resistive layer 220 may include a polymer material such as, for example, polyvinylidene fluoride and poly[(vinylidenefluoride-co-trifluoroethylene] (P(VDF/TrFE)). In yet another embodiment, the variable resistive layer 220 may include a conductive-bridging random access memory (CBRAM) material such as, for example, Ag in GeSe. According to some embodiments, the variable resistive material layer 220 may include multiple layers having characteristics of a resistance conversion material. A set voltage and/or a reset voltage of the variable resistive material layer 220 may be determined by the variable resistive material layer 220's compositions (including the values of "x" and "y"), thickness, and/or other factors known in the art.

In some embodiments, the variable resistive material layer 220 may be formed by an atomic layer deposition (ALD) technique with a precursor containing a metal and oxygen. In some embodiments, other chemical vapor deposition (CVD) techniques may be used. In some embodiments, the variable resistive material layer 220 may be formed by a physical vapor deposition (PVD) technique, such as a sputtering process with a metallic target and with a gas supply of oxygen and optionally nitrogen to the PVD chamber. In some embodiments, the variable resistive material layer 220 may be formed by an electron-beam deposition technique.

Figure 2H:
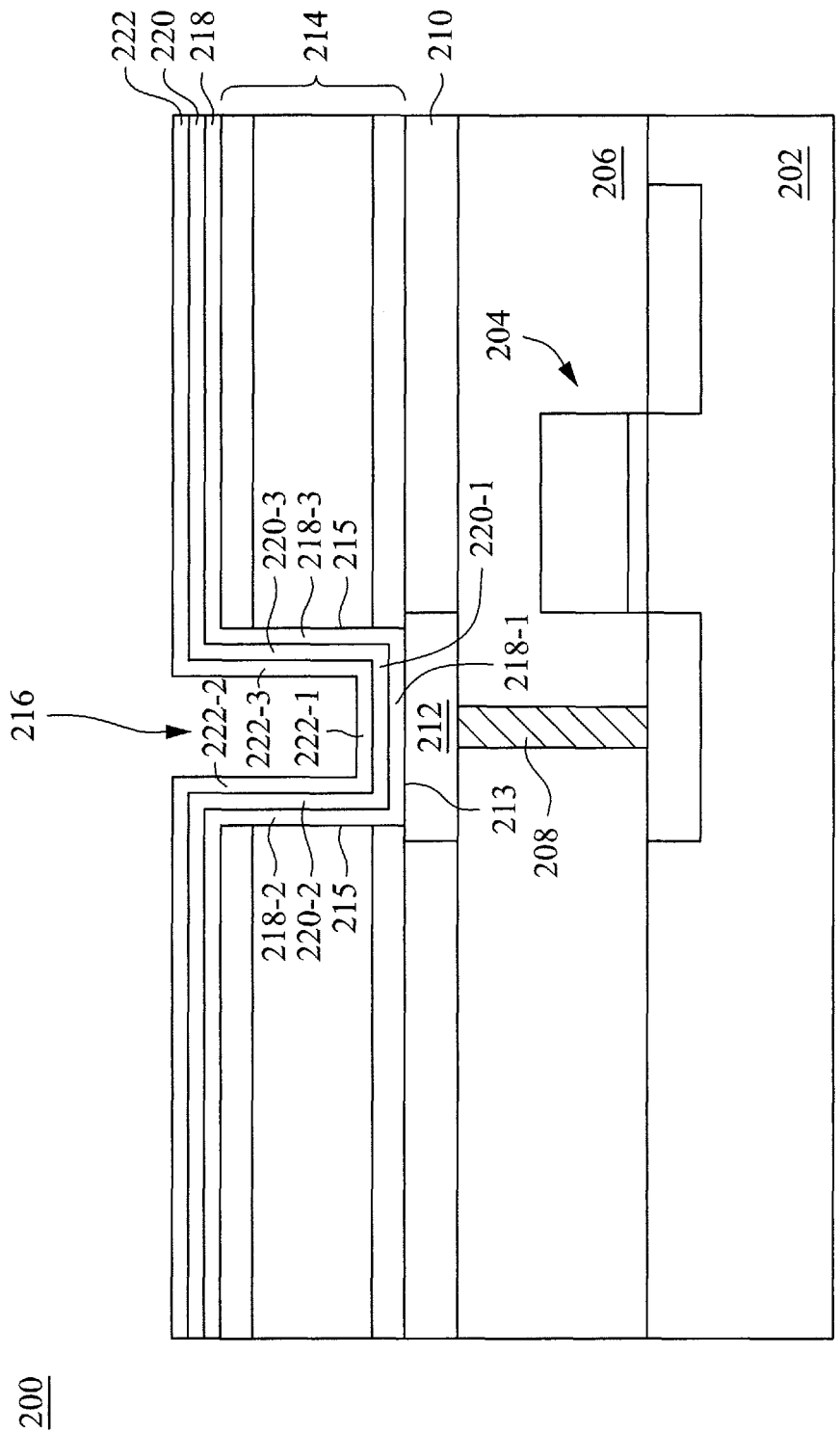

Corresponding to operation 116 of FIG. 1B, FIG. 2H is a cross-sectional view of the RRAM device 200 including a second capping layer 222, which is formed at one of the various stages of fabrication, according to some embodiments. As shown, the second capping layer 222 is formed to overlay the variable resistive material layer 220. In some embodiments, the second capping layer 222 is substantially conformal and thin (e.g., about 100~300 A in thickness) so that the second capping layer 222 may still follow the U-shaped profile 216.

As such, in some embodiments, the second capping layer 222 includes at least a horizontal portion 222-1 that is coupled to the top surface 213 of the first electrode 212 through the horizontal portion 218-1 of the first capping layer 218 and the horizontal portion 220-1 of the variable resistive material layer 220, and two vertical portions 222-2 and 222-3 that are respectively coupled to the inner sidewalls 215 of the IMD layer 214 through the vertical portions 218-2 and 218-3 of the first capping layer 218 and the vertical portions 220-2 and 220-3 of the variable resistive material layer 220. More specifically, the two vertical portions 222-2 and 222-3 are respectively coupled to two ends of the horizontal portion 222-1. When viewing perspectively, the second capping layer 222 may contact the concave top boundary of variable resistive material layer 220.

In some embodiments, the second capping layer 222 may be formed of a substantially similar material of the first capping layer 218. Thus, the second capping layer 222 may be formed from materials such as, for example, gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), or any alloy, oxide, nitride, fluoride, carbide, boride or silicide of these, such as TaN, TiN, TiAlN, TiW, or a combination thereof. Although the second capping layer 222 is shown as a single layer in the illustrated embodiment of FIG. 2H (and the following figures), it is noted that the second capping layer 222 may include plural layers formed as a stack, wherein each of the plural layers is formed of one of the above-described materials, e.g., TaN, TiN, etc. In some embodiments, the second capping layer 222 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the variable resistive material layer 220.

Figure 2I:
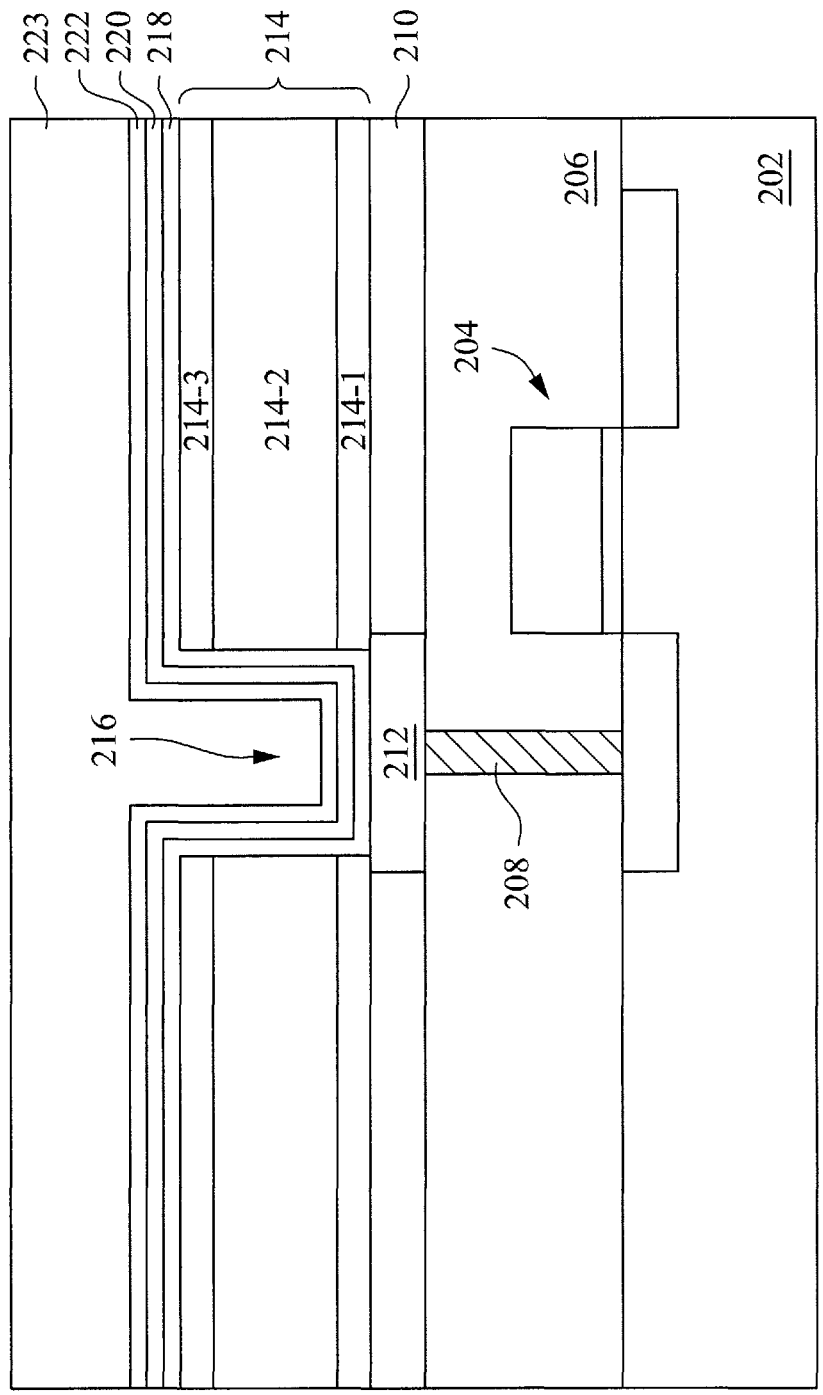

Corresponding to operation 118 of FIG. 1B, FIG. 2I is a cross-sectional view of the RRAM device 200 including a metal material 223, which is deposited at one of the various stages of fabrication, according to some embodiments. As shown, the metal material 223, which includes at least one of: copper (Cu), aluminum (Al), and tungsten (W), is deposited over the second capping layer 222. Thus, the U-shaped profile 216 may be filled by the metal material 223. In some embodiments, the U-shaped profile 216 may be filled using CVD, PVD, E-gun, and/or other suitable techniques to deposit the above-described metal material.

Figure 2J:
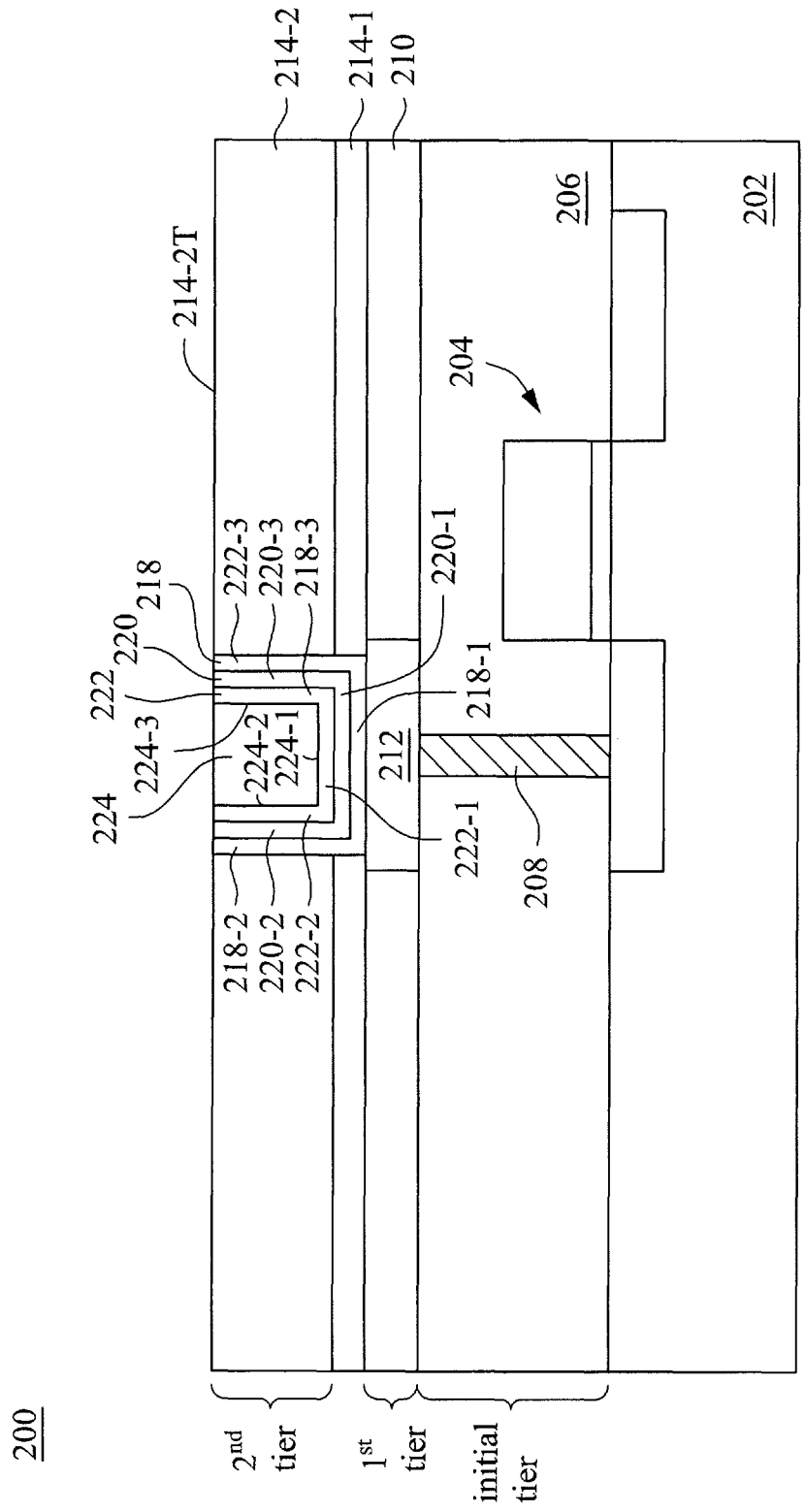

Corresponding to operation 120 of FIG. 1B, FIG. 2J is a cross-sectional view of the RRAM device 200 including a second electrode 224, which is formed at one of the various stages of fabrication, according to some embodiments. As shown, the second electrode 224 includes a bottom surface 224-1 that is coupled to the horizontal portions 222-1, 220-1, and 218-1, and two sidewalls 224-2 and 224-3 that are respectively coupled to the vertical portions 222-2/222-3, 220-2/220-3, and 218-2/218-3. That is, the second electrode 224's bottom surface 224-1, and sidewalls 224-2 and 224-3 are surrounded by the respective horizontal portions and vertical portions of the second capping layer 222, the variable resistive material layer 220, and the first capping layer 218. When viewing perspectively, the second electrode 224 may be coupled to the concave top boundary of the variable resistive material layer 220 through the second capping layer 222. In other words, in some embodiments, the second electrode 224 is partially surrounded by the horizontal portion 220-1 and two vertical portions 220-2/220-3 of the variable resistive material layer 200 while the first electrode 212 extends along the horizontal portion 220-1 of the variable resistive material layer 220 on one side of the horizontal portion 220-1 that is opposite to the other side by which the second electrode 224 is surrounded.

As such, an active area of the variable resistive material layer 220 may include respective areas of the horizontal portions 220-1, and the vertical portions 220-2 and 220-3. In comparison with the conventional RRAM device that only has one horizontally extended active area, the active area in the disclosed RRAM device 200 is substantially increased by adding at least two active areas of the vertical portions, e.g., 220-2 and 220-3 while remaining the occupied horizontal area unchanged. Moreover, as discussed above, the second electrode 224 is formed without any additional patterning process (e.g., photolithography process), which may advantageously reduce cost/complexity to manufacture the RRAM device 200.

In some embodiments, the IMD layer 214, the first electrode 212, the first capping layer 218, the variable resistive material layer 220, the second capping layer 222, and the second electrode 224 may be collectively referred to as "second tier." According to some embodiments, the second electrode 224 at the second tier may be formed by performing a chemical-mechanical polishing (CMP) process on the metal material 223 (FIG. 2I), portions of the second capping layer 222, the variable resistive material layer 220, and the first capping layer 218 that overlay a top surface of the IMD layer 214, and the third stacked layer 214-3 (FIG. 2I) of the IMD layer 214 until a top surface 214-2T of second stacked layer 214-2 is exposed. In some embodiments, concurrently with the top surface 214-2T of second stacked layer 214-2 being exposed, as shown in FIG. 2J, respective top surfaces of the vertical portions 218-2 and 218-3 of the first capping layer 218, 220-2 and 220-3 of the variable resistive material layer 220, and 222-2 and 222-3 of the second capping layer 222 are also exposed.

In some embodiments, the first electrode 212, the first capping layer 218, the variable resistive material layer 220, the second capping layer 222, and the second electrode 224 may form an RRAM resistor, wherein the first electrode 212 serves as a bottom electrode and the second electrode 224 serves as a top electrode of the RRAM resistor, respectively. In some embodiments, such an RRAM resistor is coupled to transistor 204 through the contact plug 208 so as to form a 1-transistor-1-resistor (1T1R) RRAM bit cell, wherein the RRAM resistor functions as the data storage component and the transistor 204 functions as the access transistor of the 1T1R RRAM bit cell. As mentioned above, the respective active area of the RRAM resistor of the disclosed RRAM device 200 is substantially increased while remaining the occupied horizontal area unchanged. As such, within a given area of the disclosed RRAM device 200, the number of RRAM resistors that can be integrated into the RRAM device 200 may be substantially increased without sacrificing each RRAM resistor's performance (because the respective active area does not shrink).

In an embodiment, a memory cell includes: a first electrode; a resistive material layer having a U-shaped profile; and a second electrode, wherein the second electrode is partially surrounded by a top boundary of the U-shaped profile and the first electrode extends along part of a bottom boundary of the U-shaped profile.

In another embodiment, a memory device includes: a first electrode; a resistive material layer comprising one horizontal portion and two vertical portions that are respectively coupled to ends of the horizontal portion; and a second electrode, wherein the first electrode is coupled to the one horizontal portion of the resistive material layer, and the second electrode is coupled to the one horizontal portion and two vertical portions of the resistive material layer.

Yet in another embodiment, a method includes: providing a first tier comprising a first conductive structure; forming, over the first tier, a second tier comprising a recessed region aligned with the first conductive structure; forming a resistive material layer extending along at least a profile of the recessed region, wherein the second electrode is partially surrounded by the one horizontal portion and two vertical portions of the resistive material layer, and the first electrode extends along the one horizontal portion of the resistive material layer on one side of the one horizontal portion of the resistive material layer that is opposite to the other side by which the second electrode is surrounded.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming a first conductive structure in a first dielectric layer of the semiconductor device;
   forming, over the first dielectric layer, an inter-metal dielectric layer comprising:
      a second dielectric layer formed over the first dielectric layer;
      a third dielectric layer formed over the second dielectric layer;
      a fourth dielectric layer formed over the third dielectric layer, wherein the second and fourth dielectric layers have a different etch selectivity than the third dielectric layer; and
      a recessed region aligned with the first conductive structure;
   forming a resistive material layer extending along at least a profile of the recessed region, wherein the resistive material layer is coupled to the first conductive structure;
   forming a second conductive structure within the recessed region, wherein the second conductive structure is coupled to the resistive material layer and the resistive material layer surrounds a bottom surface and side surfaces of the second conductive structure;
   removing portions of the resistive material layer, the second conductive structure and the fourth dielectric layer to expose a top surface of the third dielectric layer;
   prior to forming the resistive material layer extending along at least a profile of the recessed region, forming a first capping layer extending along the profile of the recessed region and a top surface of the inter-metal dielectric layer;
   subsequent to forming the resistive material layer extending along at least a profile of the recessed region, forming a second capping layer over the resistive material layer, wherein the second capping layer extends along the profile of the recessed region and a top surface of the resistive material layer, wherein the first and second capping layers each comprise tantalum nitride (TaN) and have a thickness in the range of 100 to 300 Angstroms.

2. The method of claim 1, wherein the third dielectric layer is thicker than each of the second and fourth dielectric layers.

3. The method of claim 1 further comprising:
   providing a substrate;
   forming a source/drain feature in the substrate; and
   forming a fifth dielectric layer over the substrate, wherein the fifth dielectric layer is disposed between the first dielectric layer and the substrate.

4. The method of claim 3, further comprising forming a contact plug in the fifth dielectric layer, wherein the contact plug is vertically aligned with the second conductive structure, the first conductive structure and the source/drain feature so as to conductively couple the first and second conductive structures to the source/drain feature.

5. The method of claim 4, further comprising:
   forming a metal layer over the second capping layer; and
   polishing the metal layer thereby forming the second conductive structure within the recessed region.

6. The method of claim 5, further comprising:
   removing portions of the metal layer, the second capping layer, the resistive material layer and the first capping layer that are not contained within the recessed region, thereby forming the second conductive structure within the recessed region, wherein the first conductive structure and remaining portions of the first capping layer, the resistive material layer, the second capping layer and the second conductive structure form a resistive random access memory (RRAM) resistor.

7. The method of claim 1, wherein the first conductive structure comprises a first electrode of a data storage element, wherein the first electrode is disposed in the first dielectric layer of the semiconductor device and the second conductive structure comprises a second electrode of the data storage element, wherein the second electrode is disposed in the inter-metal dielectric layer of the semiconductor device.

8. A method of forming a semiconductor device, the method comprising:
   forming a first electrode in a first dielectric layer of the semiconductor device;
   forming, over the first dielectric layer, an inter-metal dielectric layer, wherein the inter-metal dielectric layer comprises a recessed region aligned with the first electrode, the recessed region having a U-shaped profile;

forming a resistive material layer in the recessed region over the first electrode, the resistive material layer having the same U-shaped profile as the recessed region; and forming a second electrode over the resistive material, wherein the second electrode is partially surrounded by a top boundary of the U-shaped profile and the first electrode extends along part of a bottom boundary of the U-shaped profile, wherein the resistive material layer surrounds a bottom surface and side surfaces of the second electrode;

prior to forming the resistive material, forming a first capping layer extending along the U-shaped profile and a top surface of the inter-metal dielectric layer;

subsequent to forming the resistive material layer, forming a second capping layer over the resistive material layer, wherein the second capping layer extends along the U-shaped profile and a top surface of the resistive material layer, wherein the first and second capping layers each comprise tantalum nitride (TaN) and have a thickness in the range of 100 to 300 Angstroms; and forming a metal layer over the second capping layer, wherein the metal layer fills a recess formed by the U-shaped profile.

9. The method of claim 8, wherein the inter-metal dielectric layer comprises:
a second dielectric layer formed over the first dielectric layer;
a third dielectric layer formed over the second dielectric layer; and
a fourth dielectric layer formed over the third dielectric layer, wherein the second and fourth dielectric layers have a different etch selectivity than the third dielectric layer, and wherein the third dielectric layer is thicker than each of the second and fourth dielectric layers.

10. The method of claim 8, wherein the first electrode is disposed at a first dielectric layer of the semiconductor device and the second electrode is disposed at the inter-metal dielectric layer of the semiconductor device above the first tier.

11. The method of claim 10, wherein the resistive material layer is disposed at the inter-metal dielectric layer.

12. The method of claim 8, further comprising:
providing a substrate;
forming a source/drain feature in the substrate; and
forming a fifth dielectric layer over the substrate, wherein the fifth dielectric layer is disposed between the first dielectric layer and the substrate.

13. The method of claim 12, wherein the first electrode is coupled to a horizontal portion of the first capping layer.

14. The method of claim 13, wherein the first and second electrodes are electrodes of a data storage element.

15. The method of claim 12, further comprising:
forming a contact plug in the fifth dielectric layer, wherein the contact plug is vertically aligned with the second conductive structure, the first conductive structure and the source/drain feature so as to conductively couple the first and second conductive structures to the source/drain feature; and
forming a gate electrode in the fifth dielectric layer adjacent the contact plug, wherein the gate electrode and the source/drain feature form part of a transistor.

16. The method of claim 15, wherein:
the second capping layer comprising a horizontal portion that is coupled between a horizontal portion of the resistive material layer and the second electrode, and two vertical portions that are each coupled between one of two vertical portions of the resistive material layer and the second electrode, respectively, wherein the second capping layer surrounds a bottom surface and side surfaces of the second electrode.

17. The method of claim 8, further comprising forming a transistor coupled to the first electrode.

18. A method of forming a semiconductor device, the method comprising:
forming a first electrode in a first dielectric layer of the semiconductor device;
forming, over the first dielectric layer, an inter-metal dielectric layer comprising:
a second dielectric layer formed over the first dielectric layer;
a third dielectric layer formed over the second dielectric layer; and
a fourth dielectric layer formed over the third dielectric layer, wherein the second and fourth dielectric layers have a different etch selectivity than the third dielectric layer; and
a recessed region aligned with the first electrode, the recessed region having a U-shaped profile
forming a resistive material layer in the recessed region over the first electrode, the resistive material layer having the same U-shaped profile as the recessed region, wherein the resistive material layer comprises one horizontal portion and two vertical portions that are respectively coupled to ends of the horizontal portion;
forming a second electrode over the resistive material, wherein the second electrode is partially surrounded by a top boundary of the U-shaped profile and the first electrode extends along part of a bottom boundary of the U-shaped profile;
forming a first capping layer comprising a horizontal portion that is coupled between the first electrode and the one horizontal portion of the resistive material layer, wherein the first capping layer surrounds a bottom surface and side surfaces of the resistive material layer;
forming a second capping layer comprising a horizontal portion that is coupled between the one horizontal portion of the resistive material layer and the second electrode, and two vertical portions that are each coupled between one of the two vertical portions of the resistive material layer and the second electrode, wherein the first and second capping layers each comprise tantalum nitride (TaN) and have a thickness in the range of 100 to 300 Angstroms;
forming a metal layer over the second capping layer, wherein the metal layer fills a recess formed by the U-shaped profile; and
removing portions of the metal layer, the resistive material layer, the second electrode, the first capping layer, the second capping layer and the fourth dielectric layer to expose a top surface of the third dielectric layer, thereby forming the second electrode, wherein the first electrode and remaining portions of the first capping layer, the resistive material layer, the second capping layer and the second electrode form a resistive random access memory (RRAM) resistor.

19. The method of claim 18, wherein the third dielectric layer is thicker than each of the second and fourth dielectric layers.

20. The method of claim 18, wherein the first electrode is disposed at a first dielectric layer of the semiconductor device, the second electrode is disposed at a second tier dielectric layer of the semiconductor device above the first dielectric layer and the resistive material layer is disposed at the inter-metal dielectric layer.

* * * * *